US 6,738,288 B2

(12) United States Patent
Kawamura et al.

(10) Patent No.: US 6,738,288 B2
(45) Date of Patent: May 18, 2004

(54) SEMICONDUCTOR MEMORY

(75) Inventors: Shoichi Kawamura, Kawasaki (JP); Masaru Yano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/459,427

(22) Filed: Jun. 12, 2003

(65) Prior Publication Data

US 2004/0001356 A1 Jan. 1, 2004

(30) Foreign Application Priority Data

Jun. 26, 2002 (JP) ........................................ 2002-185539

(51) Int. Cl.[7] .............................................. G11C 16/00
(52) U.S. Cl. .............. 365/185.11; 365/198; 365/230.08
(58) Field of Search ........................... 365/185.11, 198, 365/230.08

(56) References Cited

U.S. PATENT DOCUMENTS 5,715,423 A * 2/1998 Levy ........................... 711/103
6,418,057 B1 * 7/2002 Hosogane ................. 365/185.21

* cited by examiner

Primary Examiner—Richard Elms
Assistant Examiner—Toan Le
(74) Attorney, Agent, or Firm—Arent Fox PLLC

(57) ABSTRACT

A nonvolatile semiconductor memory with a plurality of banks in which copy back is performed between banks. An input circuit accepts input of a copy back command which requests a data transfer in the memory. When the copy back command is input from the input circuit, a judgment circuit judges whether a source and a destination are in the same bank. If the judgment circuit judges that the source and the destination are in the same bank, a first transfer circuit transfers data in the same bank. If the judgment circuit judges that the source and the destination are in different banks, a second transfer circuit transfers data between the two different banks.

11 Claims, 14 Drawing Sheets

SEMICONDUCTOR MEMORY

CROSS-REFERENCE TO RELATED APPLICATIONS

This application is based upon and claims priority of Japanese Patent Application No. 2002-185539, filed on Jun. 26, 2002, the contents being incorporated herein by reference.

BACKGROUND OF THE INVENTION (1) Field of the Invention

This invention relates to a semiconductor memory, and more particularly to a nonvolatile semiconductor memory having a plurality of banks.

(2) Description of the Related Art

Flash memories are nonvolatile semiconductor memories and a copy back function has recently been added to some of these flash memories. This copy back function is for transferring data stored in a page to another page without reading out it to the outside.

In recent years the capacity of nonvolatile memories has become large. To store a large amount of data, some semiconductor memories have adopted a method for storing data in a plurality of banks by dividing it.

With such semiconductor memories having a plurality of banks, each bank includes a page buffer. Therefore, transferring data in the same bank can be achieved by storing the data read out in a page buffer and writing the data to the appropriate address.

However, transferring data between banks will need a data transfer between page buffers. Semiconductor memories having such transfer mode are not provided. Therefore, to transfer data between banks, the data is once read out to the outside and then is written again. This process is time-consuming.

SUMMARY OF THE INVENTION

The present invention was made under the background circumstances as described above. An object of the present invention is to provide a method for enabling copy back not only in the same bank but also between banks in a nonvolatile semiconductor memory having a plurality of banks.

In order to achieve the above object, a nonvolatile semiconductor memory having a plurality of banks is provided. This semiconductor memory comprises an input circuit for accepting input of a copy back command which requests a data transfer in the memory, a judgment circuit for judging at the time of the copy back command being input from the input circuit whether a source and a destination are in the same bank, a first transfer circuit for transferring, in the case of the judgment circuit judging that the source and the destination are in the same bank, data in the same bank, and a second transfer circuit for transferring, in the case of the judgment circuit judging that the source and the destination are in different banks, data between the two different banks.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Figure 1:
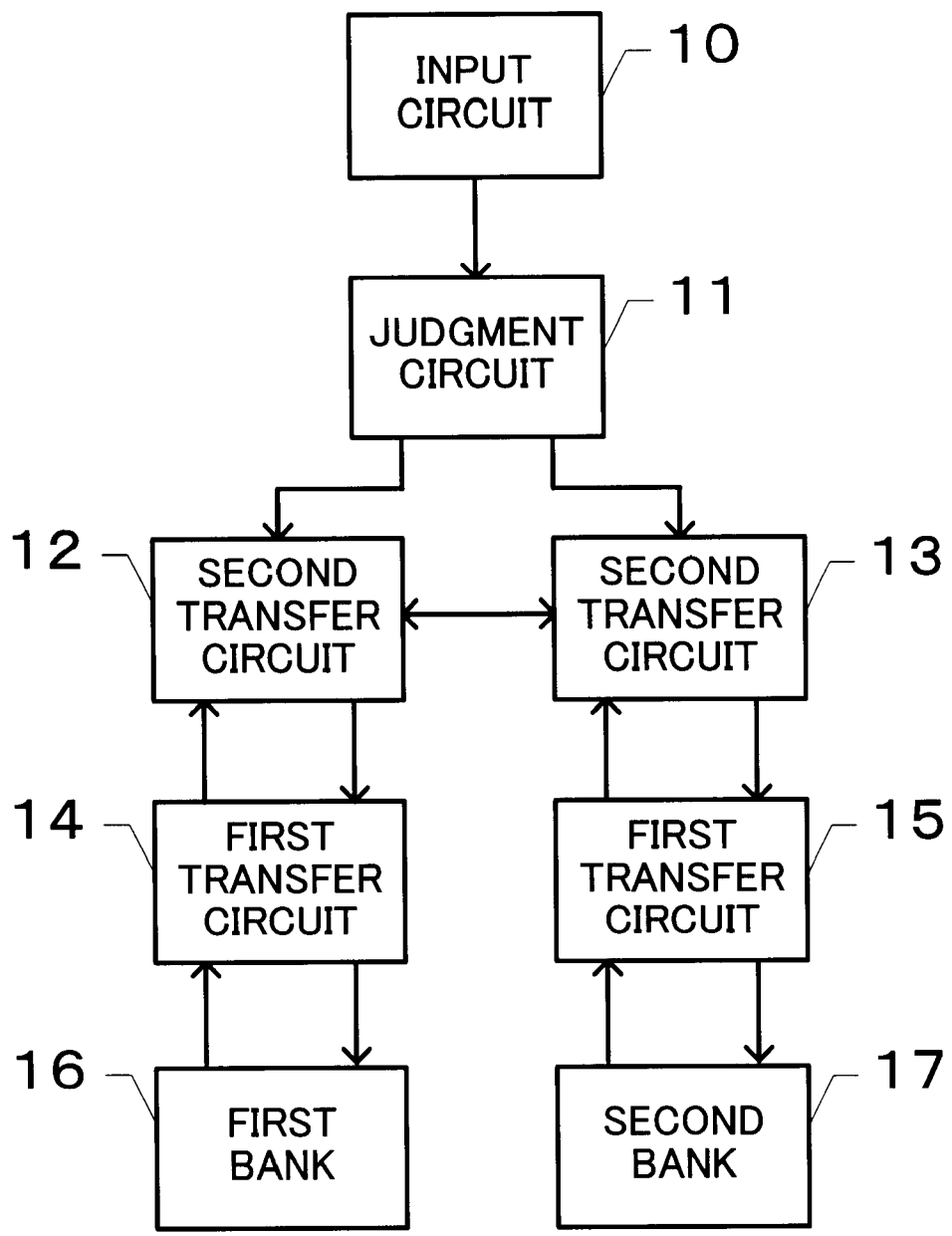
FIG. 1 is a view for describing the principles underlying operation according to the present invention.

Embodiments of the present invention will now be described with reference to the drawings. FIG. 1 is a view for describing the principles underlying the operation of a semiconductor memory according to the present invention.

As shown in FIG. 1, a semiconductor memory according to the present invention comprises an input circuit 10, a judgment circuit 11, second transfer circuits 12 and 13, first transfer circuits 14 and 15, a first bank 16, and a second bank 17.

The input circuit 10 accepts input of a copy back command which requests copy back, being a data transfer in the memory.

When a copy back command is input from the input circuit 10, the judgment circuit 11 judges whether a source and a destination are in the same bank.

If the judgment circuit 11 judges that a source and a destination are in the same bank, then the first transfer circuits 14 and 15 transfer data in the same bank.

If the judgment circuit 11 judges that a source and a destination are in different banks, then the second transfer circuits 12 and 13 transfer data between the two different banks.

Now, operation performed in FIG. 1 will be described.

When a command (copy back command) which instructs to execute copy back is input to the input circuit 10, the input circuit 10 accepts the copy back command and supplies it to the judgment circuit 11.

The judgment circuit 11 refers to a source address and destination address included in the copy back command supplied from the input circuit 10 to judge whether a transfer will be performed in the same bank. If the judgment circuit 11 judges that a transfer is performed in the same bank, then the judgment circuit 11 instructs a first transfer circuit in the appropriate bank to execute the copy back command.

For example, if instructions to transfer data in the first bank are given, then the judgment circuit 11 instructs the first transfer circuit 14 to transfer the data.

The first transfer circuit 14 reads out the data from the source address in the first bank 16, holds it temporarily in a latch circuit, and then writes it to the destination address.

Copy back operation in the same bank will be completed in this way.

On the other hand, if the judgment circuit 11 judges that instructions to transfer data between banks are given, then the judgment circuit 11 instructs the second transfer circuits 12 and 13 to perform copy back operation.

For example, if instructions to transfer data from the first bank 16 to the second bank 17 are given, then the judgment circuit 11 supplies the source address and destination address to the second transfer circuits 12 and 13 respectively.

The second transfer circuit 12 instructs the first transfer circuit 14 to read out data stored at the source address. As a result, the first transfer circuit 14 reads out the data from the source address in the first bank 16, stores it temporarily in a built-in latch circuit, and then supplies it to the second transfer circuit 12.

The second transfer circuit 12 receives the data supplied from the first transfer circuit 14, supplies it to the first transfer circuit 15 via the second transfer circuit 13, and instructs the first transfer circuit 15 to write it to the destination address.

As a result, the first transfer circuit 15 receives the data supplied from the second transfer circuit 13, holds it temporarily in a built-in latch circuit, and then writes it to the destination address in the second bank 17.

Copy back operation between banks will be completed in this way.

As described above, with the semiconductor memory according to the present invention whether transfer is performed in the same bank is judged when a copy back command is input. If transfer is performed in the same bank, data will be transferred by the first transfer circuits 14 and 15. If transfer is performed between banks, data will be transferred by the second transfer circuits 12 and 13. Therefore, whether transfer is performed in the same bank or between banks, copy back can be executed.

In FIG. 1, descriptions have been given with a case where the number of banks is two as an example. However, the present invention is applicable to cases where there are more than two banks.

Now, embodiments of the present invention will be described.

Figure 2:
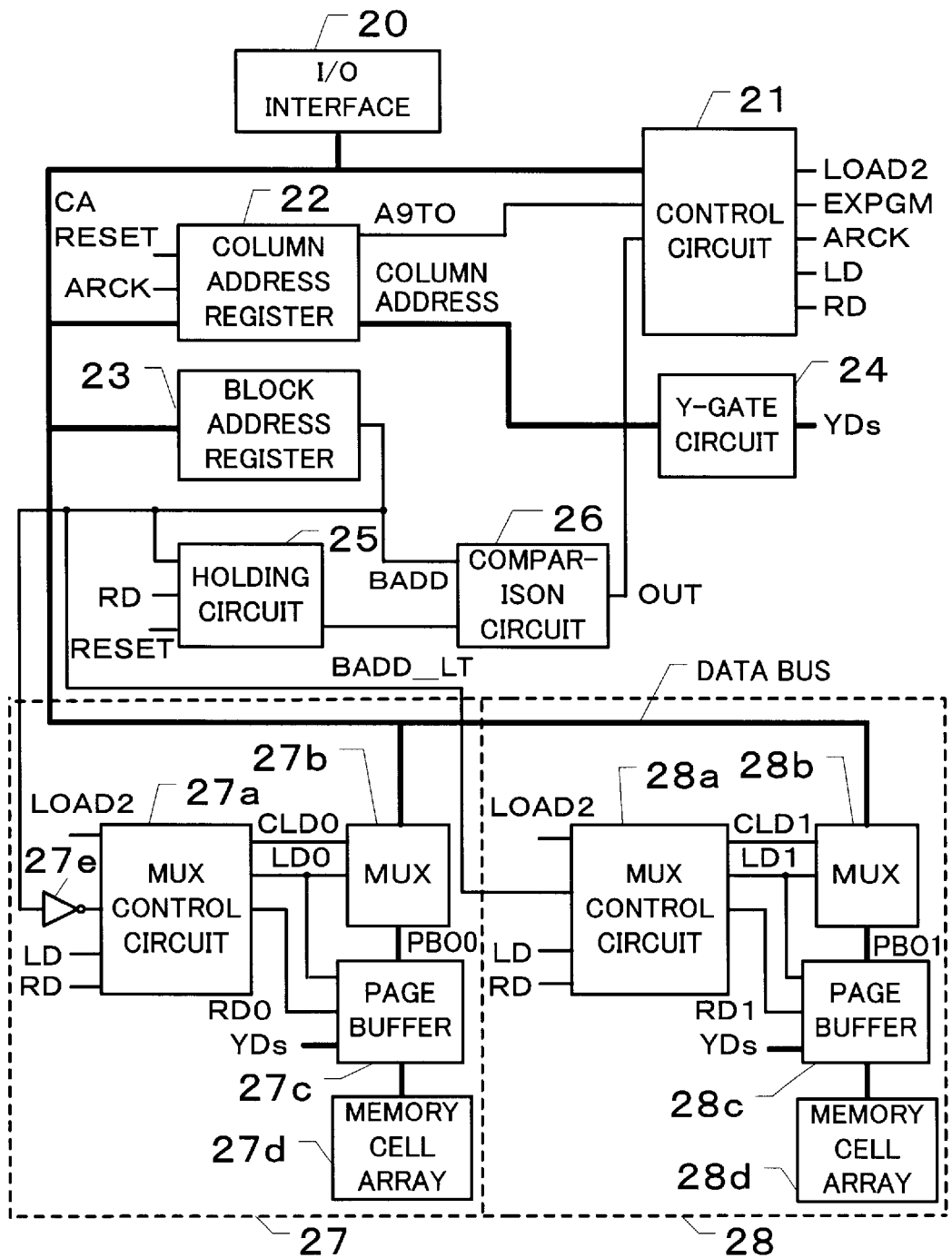
FIG. 2 is a view showing the structure of a first embodiment of the present invention.

FIG. 2 is a view showing the structure of a first embodiment of the present invention. As shown in FIG. 2, the first embodiment of the present invention comprises an I/O interface 20, a control circuit 21, a column address register 22, a block address register 23, a Y-gate circuit 24, a holding circuit 25, a comparison circuit 26, and banks 27 and 28.

The I/O interface 20 is connected to an external unit. When the I/O interface 20 exchanges data with this external unit, the I/O interface 20 converts, for example, the representation format of the data.

The control circuit 21 controls each section of the memory according to data input via the I/O interface 20.

The column address register 22 generates a column address signal for specifying a column address and supplies it to the Y-gate circuit 24.

The block address register 23 stores data for specifying a block address where operation for executing, for example, a copy back command is performed.

The Y-gate circuit 24 generates a YDs signal (Y-address decode signal) on the basis of a column address supplied from the column address register 22 and supplies it to the banks 27 and 28.

The holding circuit 25 temporarily holds a block address supplied from the block address register 23.

The comparison circuit 26 compares a block address supplied from the block address register 23 and a block address held by the holding circuit 25 and informs the control circuit 21 of a comparison result.

Each of the banks 27 and 28 stores data supplied from the outside and outputs data it stores to the outside. Moreover, when a copy back command is input, data is transferred in the same bank or between the banks 27 and 28.

Now, descriptions will be given with the bank 27 as an example. The bank 27 includes a multiplexer (MUX) control circuit 27a, a MUX 27b, a page buffer 27c, a memory cell array 27d, and an inverter 27e. The bank 28 does not include an inverter.

The MUX control circuit 27a controls the MUX 27b and page buffer 27c.

Under the control of the MUX control circuit 27a, the MUX 27b delays data in the page buffer 27c by predetermined time, inverts its logic at need, and outputs it to a data bus. Moreover, the MUX 27b reads data on the data bus, delays it by predetermined time, and supplies it to the page buffer 27c.

As described later, the page buffer 27c includes a latch circuit and a buffer. When data is read out from or written to the memory cell array 27d, the page buffer 27c temporarily stores the data. When data read out from the memory cell array 27d is output to the outside, the page buffer 27c amplifies its signal level.

The memory cell array 27d consists of, for example, NAND type memory cells. The memory cell array 27d stores data and outputs data it stores to the outside.

Figure 3:
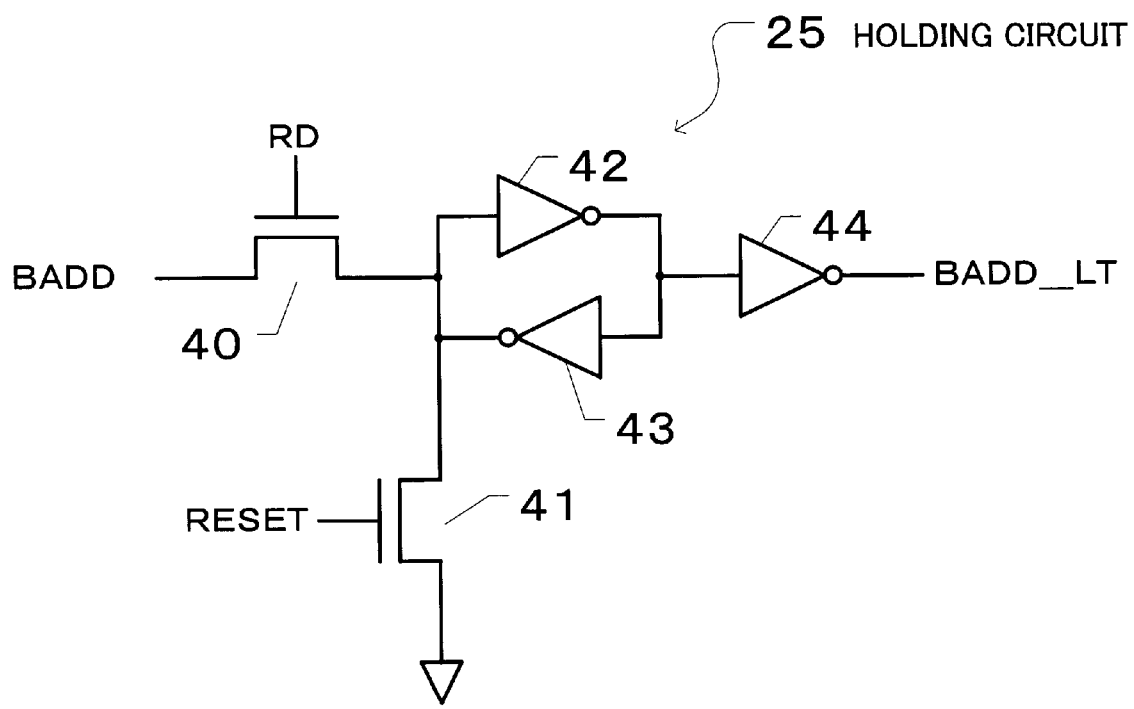
FIG. 3 is a detailed view showing the structure of the holding circuit shown in FIG. 2.

FIG. 3 is a detailed view showing the structure of the holding circuit 25 shown in FIG. 2. As shown in FIG. 3, the holding circuit 25 includes n-channel metal oxide semiconductor field effect transistors (MOSFETs) 40 and 41 and inverters 42 through 44.

If a read (RD) signal supplied from the control circuit 21 is in the "H" state, that is to say, if the semiconductor memory is operating in read mode, then the holding circuit 25 latches a bank address (BADD) signal by a latch circuit made up of the inverters 42 and 43, inverts it by the inverter 44, and outputs it as a BADD_LT signal. When a RESET signal goes into the "H" state, the holding circuit 25 resets the latch circuit.

Figure 4:
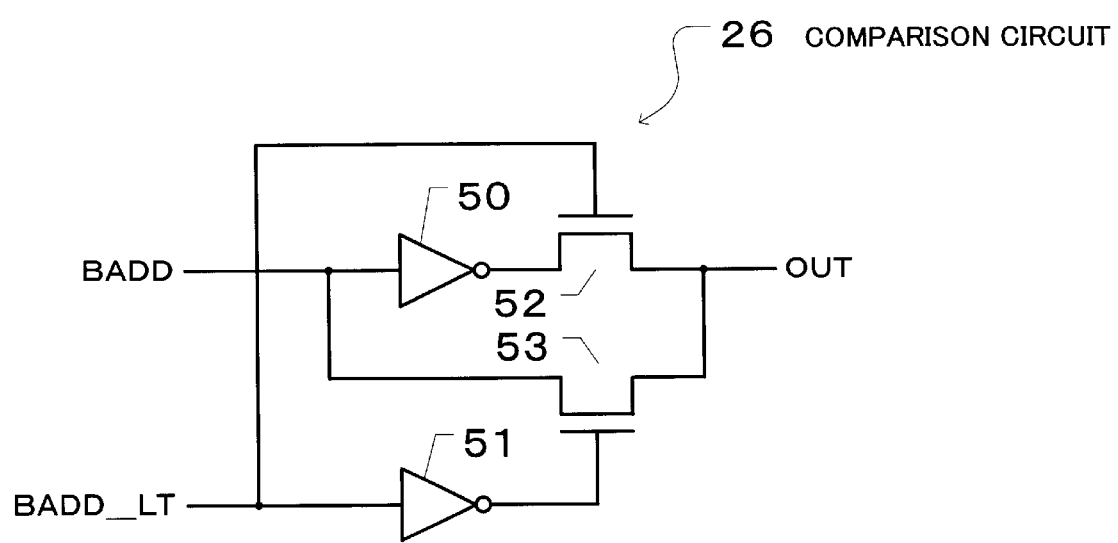
FIG. 4 is a detailed view showing the structure of the comparison circuit shown in FIG. 2.

FIG. 4 is a detailed view showing the structure of the comparison circuit 26 shown in FIG. 2. As shown in FIG. 4, the comparison circuit 26 includes inverters 50 and 51 and n-channel MOSFETs 52 and 53.

The comparison circuit 26 inputs a BADD signal supplied from the block address register 23 and a BADD_LT signal supplied from the holding circuit 25. If these signals are in the same state, then the comparison circuit 26 puts an OUT signal, being an output signal, into the "L" state. If these signals are not in the same state, then the comparison circuit 26 puts an OUT signal into the "H" state.

Figure 5:
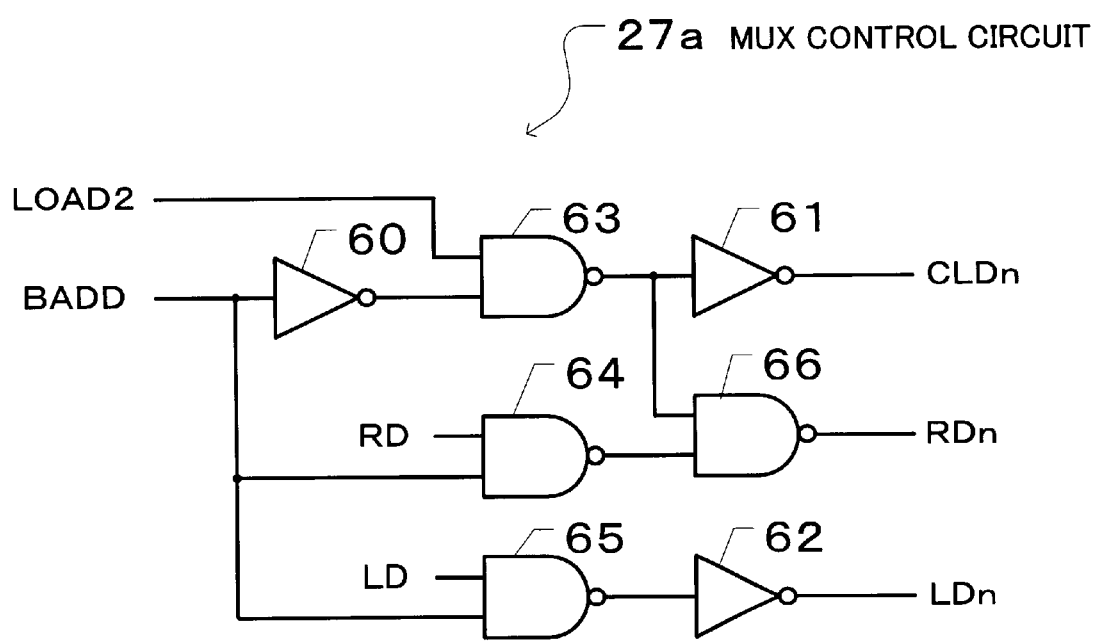
FIG. 5 is a detailed view showing the structure of the MUX control circuit shown in FIG. 2.

FIG. 5 is a detailed view showing the structure of the MUX control circuit 27a shown in FIG. 2. As shown in FIG.

5, the MUX control circuit 27a includes inverters 60 through 62 and NAND gates 63 through 66.

The MUX control circuit 27a inputs a LOAD2 signal which instructs in copy back mode to transfer data from a bank to another bank, a BADD signal, an RD signal, and an LD signal (write signal), generates a CLDn signal, an RDn signal, and an LDn signal from these signals, and outputs them.

The CLDn signal is a load signal at the time of the semiconductor memory being in copy back mode. The RDn signal is a local read signal from the page buffer 27c or 28c. RD0 and RD1 indicate the banks 27 and 28 respectively. The LDn signal is a local load signal to the page buffer 27c or 28c. LD0 and LD1 indicate the banks 27 and 28 respectively.

Figure 6:
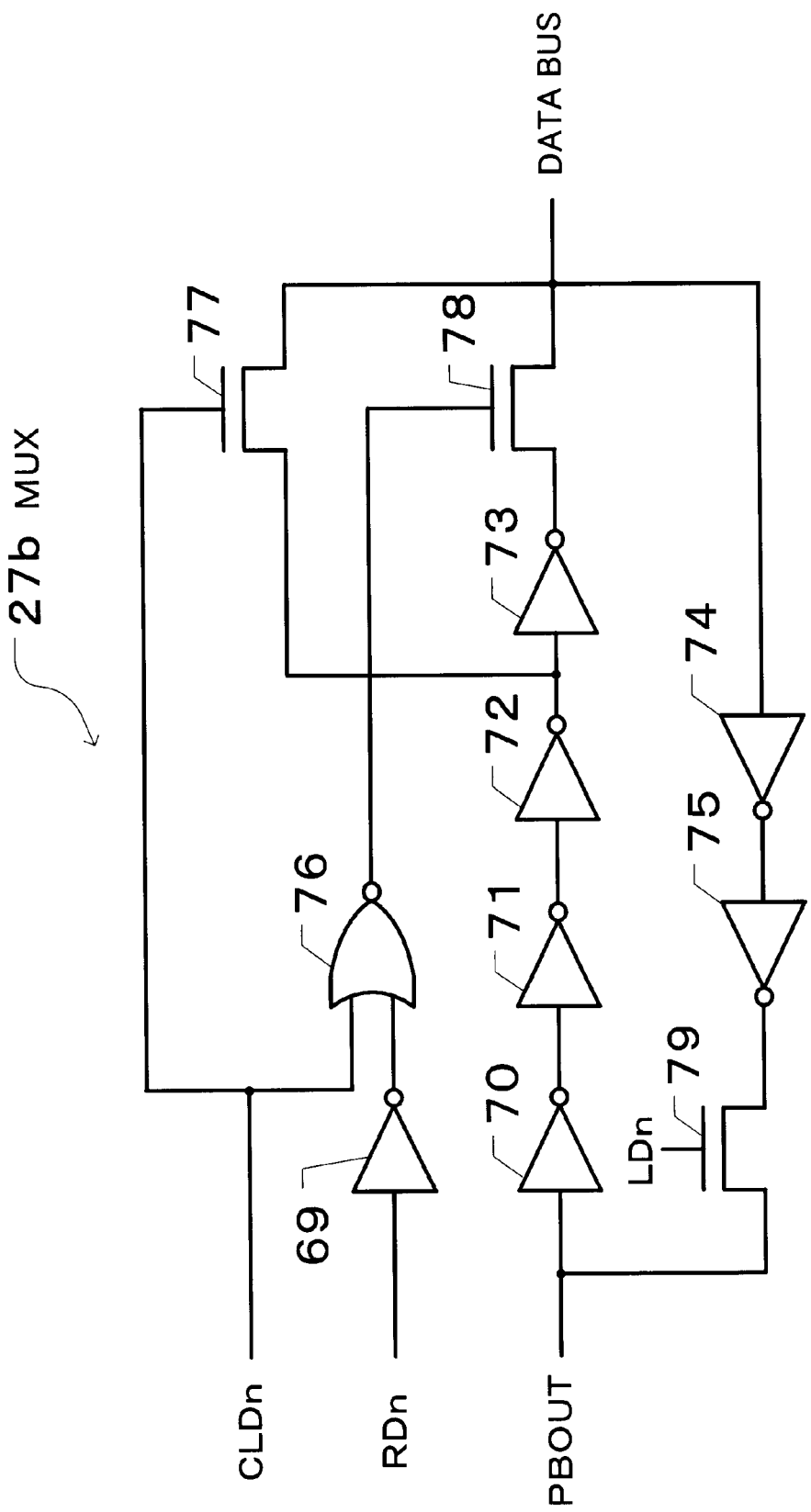
FIG. 6 is a detailed view showing the structure of the MUX shown in FIG. 2.

FIG. 6 is a detailed view showing the structure of the MUX 27b shown in FIG. 2. As shown in FIG. 6, the MUX 27b includes inverters 69 through 75, a NOR gate 76, and n-channel MOSFETs 77 through 79.

When the semiconductor memory is in copy back mode, that is to say, when a CLDn signal is in the "H" state, the MUX 27b delays and inverts a PBOUT signal output from the page buffer 27c by the inverters 70 through 72 and outputs it to a data bus. When the semiconductor memory is in normal read mode (in other words, an CLDn signal is in the "L" state) and an RDn signal is in the "H" state, the MUX 27b delays a PBOUT signal by the inverters 70 through 73 and outputs it. Moreover, when the semiconductor memory is in normal load mode, that is to say, when an LDn signal is in the "H" state, the MUX 27b delays a signal on the data bus by the inverters 74 and 75 and supplies it to the page buffer 27c.

Figure 7:
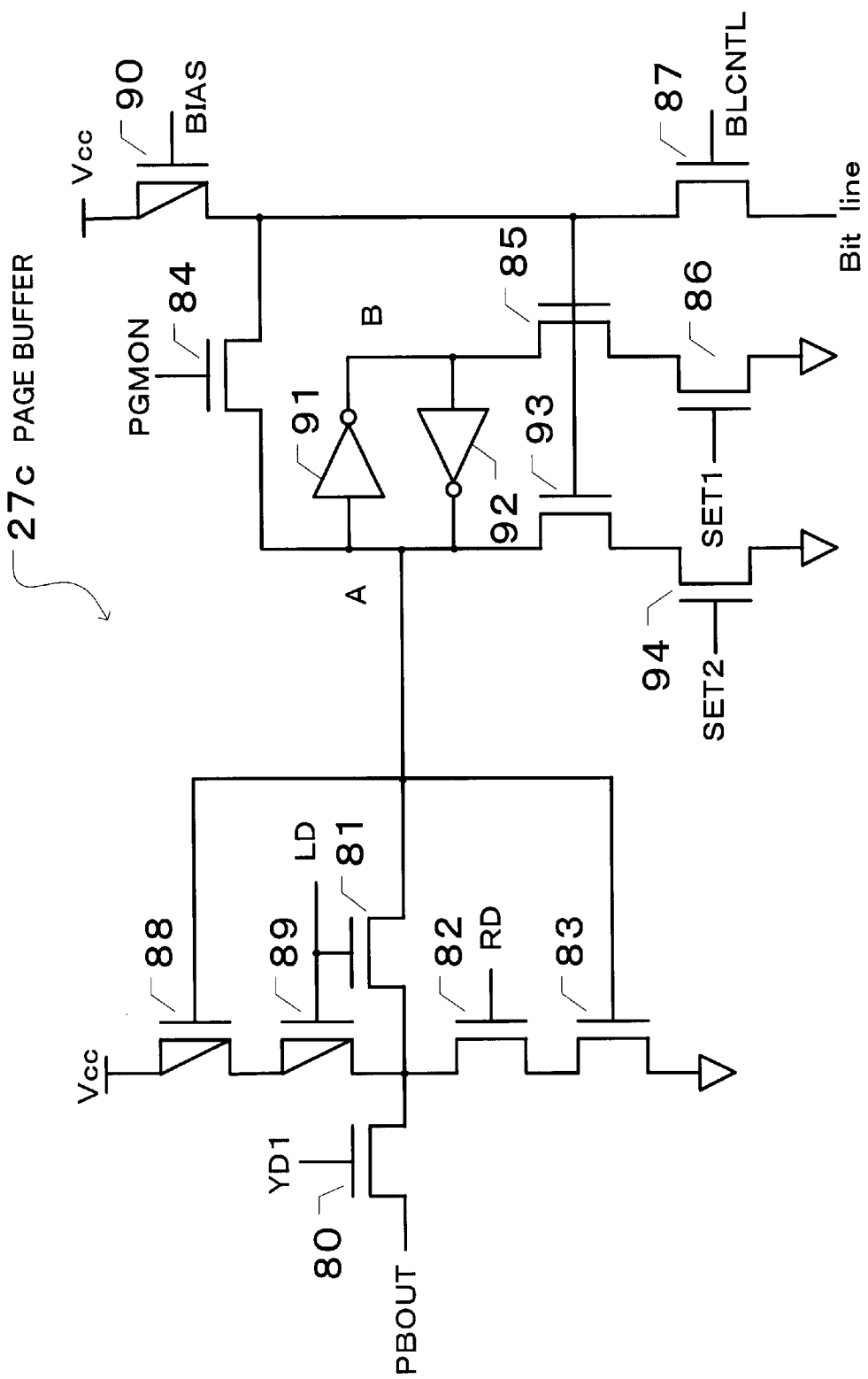
FIG. 7 is a detailed view showing the structure of the page buffer shown in FIG. 2.

FIG. 7 is a view showing the structure of the basic unit of the page buffer 27c shown in FIG. 2. As shown in FIG. 7, the page buffer 27c includes n-channel MOSFETs 80 through 87, p-channel MOSFETs 88 through 90, inverters 91 and 92, and n-channel MOSFETs 93 and 94.

The n-channel MOSFETs 80 through 83 and p-channel MOSFETs 88 and 89 make up a buffer. When an LD signal is in the "H" state and an RD signal is in the "L" state, the n-channel MOSFET 82 and p-channel MOSFET 89 are in the OFF state. Therefore, when a YD1 signal goes into the "H" state, the page buffer 27c inputs output from the MUX 27b in its original condition.

When an LD signal is in the "L" state and an RD signal is in the "H" state, the n-channel MOSFET 82 and p-channel MOSFET 89 are in the ON state. Therefore, the n-channel MOSFET 83 and p-channel MOSFET 88 make up an inverter. When a YD1 signal goes into the "H" state, the page buffer 27c inverts and outputs a signal applied to node A.

The n-channel MOSFETs 84 through 87, p-channel MOSFET 90, inverters 91 and 92, and n-channel MOSFETs 93 and 94 make up a latch circuit and write circuit. At normal read operation time, a SET1 signal is put into the "H" state and a BLCNTL signal is put into the "H" state. As a result, voltage applied to a bit line connected to a cell in the memory cell array to be read is supplied via the n-channel MOSFET 85 to the latch circuit made up of the inverters 91 and 92 and is latched.

When the semiconductor memory is in copy back mode, a BLCNTL signal and SET2 signal are put into the "H" state. As a result, voltage applied to a bit line connected to a cell to be read is supplied via the n-channel MOSFET 93 to the latch circuit made up of the inverters 91 and 92 and is latched.

At write operation time, a BLCNTL signal is put into the "H" state and a PGMON signal is put into the "H" state.

Therefore, data latched by the latch circuit made up of the inverters 91 and 92 is written to a memory cell via the n-channel MOSFETs 84 and 87.

Now, operation in the first embodiment will be described. Copy back operation in the same bank and copy back operation between banks will be described.

(1) Copy Back Operation in the Same Bank

Now, copy back operation in the bank 27 will be described as an example.

First, when an inverted read command is input, an RD signal output from the control circuit 21 goes into the "H" state. When a source address is input after that, data indicative of a source block is stored in the block address register 23 and a BADD signal is output on the basis of this data. In this example, the bank 27 is a source, so the BADD signal goes into the "L" state (if the bank 28 is a source, so the BADD signal goes into the "H" state).

The holding circuit 25 latches this BADD signal in a latch circuit made up of the inverters 42 and 43 shown in FIG. 3 and outputs a result obtained by inverting the latched data. As a result, a BADD_LT signal output from the holding circuit 25 goes into the "L" state.

Data is read out from the source address in the memory cell array 27d in the bank 27 and is stored in the page buffer 27c. Now, attention will be given to a single bit. In the circuit shown in FIG. 7, a BIAS signal is put into the "L" state and a SET1 signal is put into the "H" state. By doing so, the node A goes into the "H" state, the node B goes into the "L" state, and the latch circuit made up of the inverters 91 and 92 is initialized.

Next, the SET1 signal is returned to the "L" state and a BLCNTL signal is put into the "H" state. By doing so, the circuit shown in FIG. 7 is connected to a bit line and sense operation is begun. When a certain period of time has elapsed after the sense operation being begun, a SET2 signal is put into the "H" state and data sensed is imported into the latch circuit made up of the inverters 91 and 92.

It is assumed that data stored in a memory cell is "0." Then the memory cell is electrically in the OFF state. Therefore, when the n-channel MOSFET 87 goes into the ON state, input to the n-channel MOSFETs 85 and 93 goes into the "H" state.

When the SET2 signal goes into the "H" state in this state of things, both of the n-channel MOSFETs 93 and 94 go into the ON state and are grounded. As a result, the node A goes into the "L" state. Therefore, the nodes A and B of the latch circuit made up of the inverters 91 and 92 latch the "L" and "H" states respectively.

Subsequently, when a destination address input command is input, the control circuit 21 puts the RD signal into the "L" state. When a destination address is input, data indicative of a destination block is stored in the block address register 23 and a BADD signal is output on the basis of this data. In this example, copy back is performed in the bank 27, so the BADD signal goes into the "L" state.

The comparison circuit 26 inputs the BADD_LT signal corresponding to the data indicative of the source bank stored in the holding circuit 25 and compares this BADD_LT signal and the BADD signal. In this example, these signals are in the "L" state, so an OUT signal output from the comparison circuit 26 goes into the "L" state. The control circuit 21 puts a LOAD2 signal into the "L" state because a transfer will be performed in the same bank. Moreover, the control circuit 21 puts an LD signal into the "H" state because write operation will be performed.

On the basis of, for example, the LOAD2 signal supplied from the control circuit 21 and the BADD signal supplied from the block address register 23, the MUX control circuit 27a puts a CLD0 signal indicative of load at copy back time into the "L" state, puts an RD0 signal into the "L" state, and puts an LD0 signal into the "H" state. As a result, the data latched by the page buffer 27c will be written to the memory cell array.

To be concrete, a PGMON signal, the BIAS signal, the BLCNTL signal, the SET1 signal, and the SET2 signal go into the "H," "H," "H," "L," and "L" states respectively. Therefore, voltage applied to the node A of the latch circuit made up of the inverters 91 and 92 is read out via the n-channel MOSFET 84 and is written to a predetermined cell in the memory cell array 27d via the n-channel MOSFET 87.

In this example, the node A is in the "L" state, so "0" will be written to the predetermined cell in the memory cell array 27d.

After writing to the memory cell is completed, verify operation will be performed to check whether the data was written normally. In this verify operation, the PGMON signal, the BIAS signal, and the BLCNTL signal are put first into the "L," "L," and "H" states, respectively, to perform sense operation. After a certain period of time has elapsed, the SET1 signal is put into the "H" state. As a result, the data written is read out and is latched by the latch circuit made up of the inverters 91 and 92. If writing was performed normally, the nodes A and B will go into the "H" and "L" states respectively. Subsequent writing therefore is prohibited. The same operation will be performed on memory cells not to be written.

If writing to the memory cell was not performed normally, the nodes A and B will go into the "L" and "H" states, respectively, after the SET1 signal being put into the "H" state. Therefore, writing and verify operation will be repeated until writing is performed normally.

By performing the above operation, copy back operation in the same bank will be completed.

(2) Copy Back Operation Between Banks

Now, operation performed when copy back from the bank 27 to the bank 28 is executed will be described.

First, when an inverted read command is input, an RD signal output from the control circuit 21 goes into the "H" state. When a source address is input after that, data indicative of a source block is stored in the block address register 23 and a BADD signal is output on the basis of this data. In this example, the bank 27 is a source, so the BADD signal goes into the "L" state.

The holding circuit 25 latches this BADD signal in the latch circuit made up of the inverters 42 and 43 shown in FIG. 3 and outputs a result obtained by inverting the latched data. As a result, a BADD_LT signal output from the holding circuit 25 goes into the "L" state.

Data is read out from the source address in the memory cell array 27d in the bank 27 and is stored in the page buffer 27c. Now, attention will be given to a single bit. In the circuit shown in FIG. 7, a BIAS signal is put into the "L" state and a SET1 signal is put into the "H" state. By doing so, the node A goes into the "H" state, the node B goes into the "L" state, and the latch circuit made up of the inverters 91 and 92 is initialized. Next, the SET1 signal is returned to the "L" state and a BLCNTL signal is put into the "H" state. By doing so, the circuit shown in FIG. 7 is connected to a bit line and sense operation is begun. When a certain period of time has elapsed after the sense operation being begun, a SET2 signal is put into the "H" state and data sensed is imported into the latch circuit made up of the inverters 91 and 92.

It is assumed that data stored in a memory cell is "0." Then the memory cell is electrically in the OFF state. Therefore, when the n-channel MOSFET 87 goes into the ON state, input to the n-channel MOSFETs 85 and 93 goes into the "H" state.

When the SET2 signal goes into the "H" state in this state of things, both of the n-channel MOSFETs 93 and 94 go into the ON state and are grounded. As a result, the node A goes into the "L" state. Therefore, the nodes A and B of the latch circuit made up of the inverters 91 and 92 latch the "L" and "H" states respectively.

Subsequently, when a destination address input command is input, the control circuit 21 puts the RD signal into the "L" state. When a destination address is input, data indicative of a destination block is stored in the block address register 23 and a BADD signal is output on the basis of this data. In this example, the bank 28 is a destination, so the BADD signal goes into the "H" state.

The comparison circuit 26 inputs the BADD_LT signal corresponding to the data indicative of the source bank stored in the holding circuit 25 and compares this BADD_LT signal and the BADD signal. In this example, the BADD signal is in the "H" state and the BADD_LT signal is in the "L" state. Therefore, an OUT signal output from the comparison circuit 26 goes into the "H" state.

The control circuit 21 puts a LOAD2 signal into the "H" state because a transfer will be performed between the banks 27 and 28. Moreover, the control circuit 21 puts an LD signal into the "H" state because write operation will be performed.

As a result, in the MUX control circuit 27a the LOAD2 signal, BADD signal, RD signal, and LD signal shown in FIG. 5 go into the "H," "L," "L," "H" and "H" states respectively. Therefore, a CLD0 signal, RD0 (n=0) signal, and LD0 signal go into the "H," "H," and "L" states respectively.

In the MUX 27b where these signals are input, the n-channel MOSFET 77 goes into the ON state and the n-channel MOSFETs 78 and 79 go into the OFF state. Therefore, the data output from the page buffer 27c is output to a data bus via the inverters 70 through 72. As a result, the data will be inverted and be output.

On the other hand, in the MUX control circuit 28a the LOAD2 signal, BADD signal, RD signal, and LD signal shown in FIG. 5 go into the "H," "H," "L," and "H" states respectively. Therefore, a CLD1 signal, RD1 (n=1) signal, and LD1 signal go into the "L," "L," and "H" states respectively.

Accordingly, in the MUX 28b where these signals are input, the n-channel MOSFETs 77 and 78 go into the OFF state and the n-channel MOSFET 79 goes into the ON state. As a result, the data input from the data bus is output to the page buffer 28c via the inverters 74 and 75. That is to say, the data will be output in its original condition.

At this time a CARESET signal input to the column address register 22 is put into the "H" state, so a column address is reset to "0." Each time an ARCK signal is toggled, a column address will be incremented by one. Output from the column address register 22 is supplied to the Y-gate circuit 24. The Y-gate circuit 24 generates a YDs signal and supplies it to the page buffers 27c and 28c. As a result, data specified by a column address is read out from the page buffer 27c, is inverted by the MUX 27b, flows through the MUX 28b, and is latched by a latch circuit in the page buffer 28c. This operation will be continued until an A9TO signal output from the column address register 22 goes into the "H" state, that is to say, until the transfer of data at all column addresses is completed.

When the transfer of data at all column addresses is completed, the MUX control circuit 28a puts a CLD1 signal indicative of load at copy back time, an RD1 signal, and an LD1 signal into the "L," "L," and "H" states, respectively, on the basis of, for example, the LOAD2 signal supplied from the control circuit 21 and the BADD signal supplied from the block address register 23. As a result, the data latched by the page buffer 28c will be written to the memory cell array 28d.

To be concrete, a PGMON signal, the BIAS signal, the BLCNTL signal, the SET1 signal, and the SET2 signal go into the "H," "H," "H," "L," and "L" states respectively. Therefore, voltage applied to the node A of the latch circuit made up of the inverters 91 and 92 is read out via the n-channel MOSFET 84 and is written to a predetermined cell in the memory cell array 28d via the n-channel MOSFET 87.

In this example, the node A is in the "L" state, so "0" will be written to the predetermined cell in the memory cell array 28d.

After writing to the memory cell is completed, verify operation will be performed to check whether the data was written normally. In this verify operation, the PGMON signal, the BIAS signal, and the BLCNTL signal are put first into the "L," "L," and "H" states, respectively, to perform sense operation. After a certain period of time has elapsed, the SET1 signal is put into the "H" state. As a result, the data written is read out and is latched by the latch circuit made up of the inverters 91 and 92. If the data was written normally, the nodes A and B will go into the "H" and "L" states respectively. Subsequent writing therefore is prohibited. The same operation will be performed on memory cells not to be written.

With a memory cell where writing was not performed normally, the nodes A and B will go into the "L" and "H" states, respectively, after the SET1 signal being put into the "H" state. Therefore, writing and verify operation will be repeated until writing is performed normally.

By performing the above operation, copy back operation between banks will be completed.

As described above, with the first embodiment of the present invention data held in a latch circuit is written again in the case of transferring in the same bank. Moreover, in the case of transferring between banks, data held in a latch circuit is transferred in order of column address to a latch circuit in a destination bank and is written. Therefore, data can be copied back not only in the same bank but also between banks.

Furthermore, conventionally, to write again data read out to the same bank, the operation of inverting the logic of the data has been necessary. In the present invention, however, data can be written in its original condition without its logic being inverted. Now, this will be described in detail.

Figure 8:
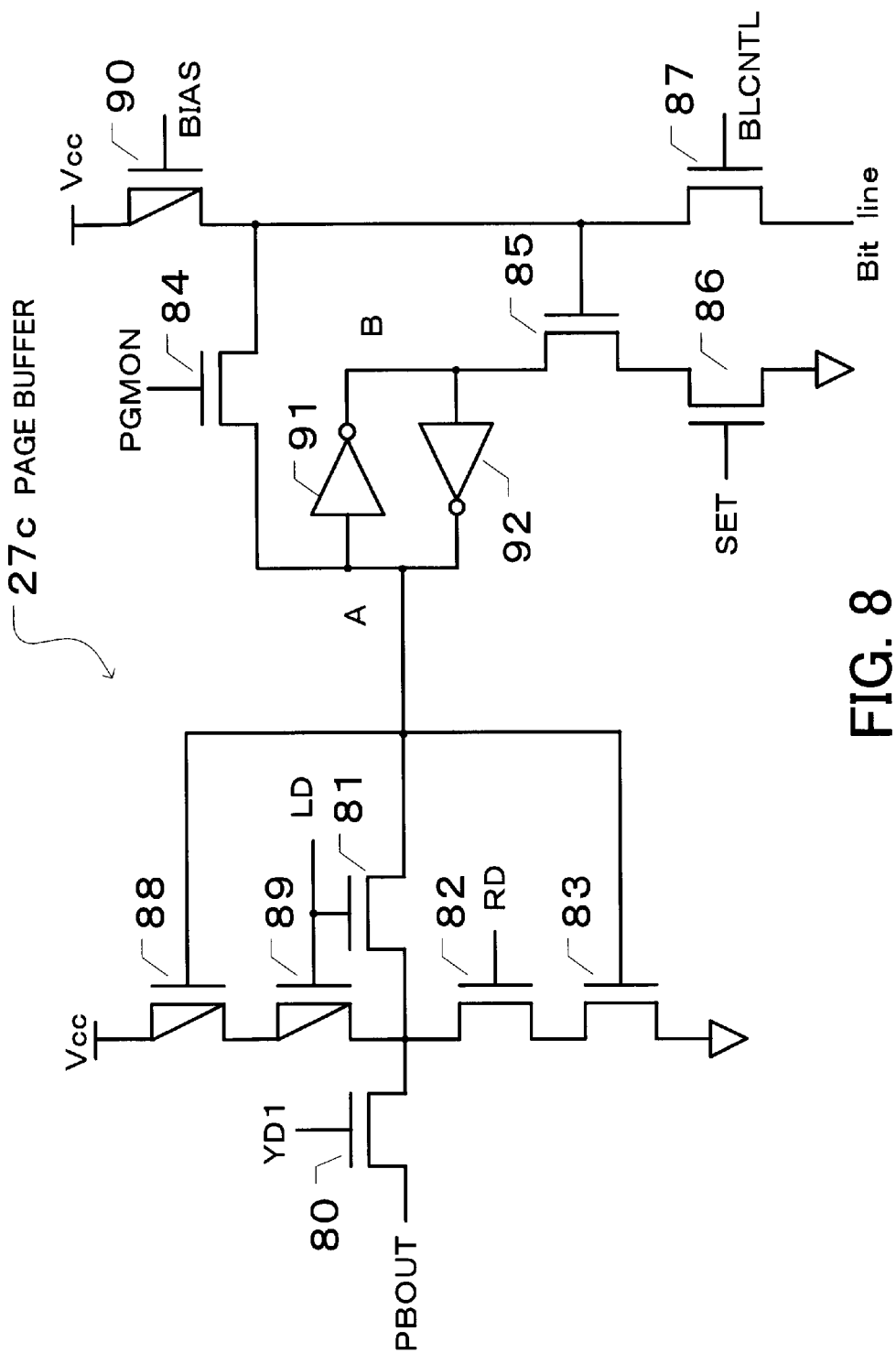
FIG. 8 is a detailed view showing the structure of a conventional page buffer.

FIG. 8 is a view showing the structure of a conventional page buffer. Components in FIG. 8 which correspond to those shown in FIG. 7 are marked with the same symbols and descriptions of them will be omitted. This conventional page buffer is the same as the page buffer 27c shown in FIG. 7, except that the conventional page buffer does not include n-channel MOSFETs 93 and 94.

With the conventional page buffer shown in FIG. 8, data is read out from a memory cell in the following way. A SET signal and BLCNTL signal are put into the "H" state and voltage applied to a bit line is latched in a latch circuit made up of inverters 91 and 92. It is assumed that "0" has been written to the memory cell. When the BLCNTL signal goes into the "H" state, an n-channel MOSFET 85 goes into the ON state because the memory cell is in the OFF state. Moreover, the SET signal goes into the "H" state, so nodes B and A go into the "L" and "H" states respectively.

If the data which has been written to the latch circuit is written again to another memory cell in this state of things, a PGMON signal and the BLCNTL signal are put into the "H" state. As a result, the "H" state will be supplied instead of the "L" state. That is to say, "1" will be written again. Therefore, the logic of the data at the nodes A and B of the latch circuit must be inverted before writing again.

In the above embodiment, however, a memory cell is read in copy back mode by putting a SET2 signal into the "H" state. As a result, the node A goes into the "L" state. Therefore, by writing the data at the node A again, the original data will be written again. This will cause no inconvenience.

Figure 9:
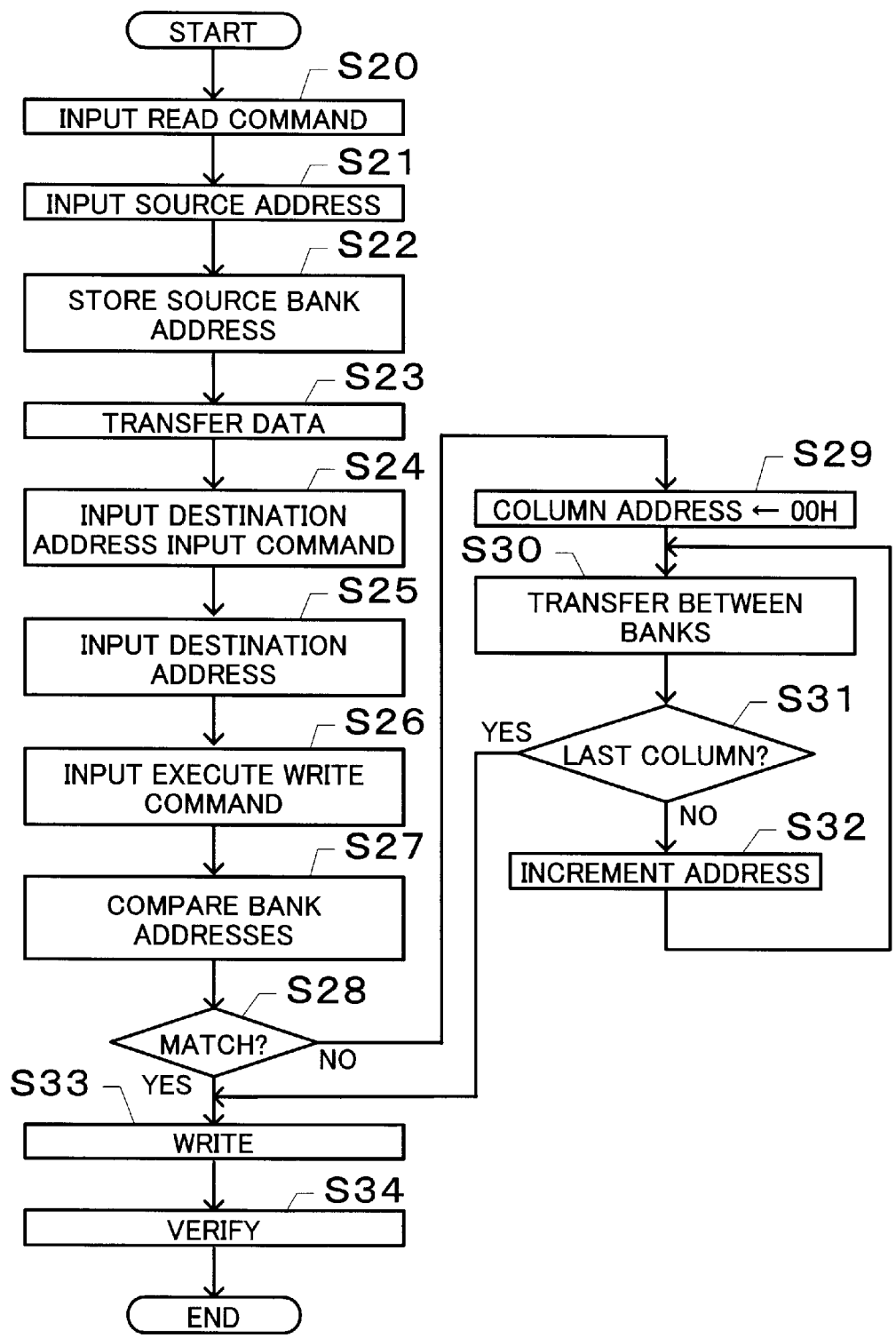
FIG. 9 is a flow chart for describing the flow of a process performed in the embodiment shown in FIG. 2.

Now, the flow of a process performed in the first embodiment will be described by reference to FIG. 9. The following steps will be performed if a process shown in FIG. 9 is begun.

[Step S20] The control circuit 21 inputs a read command via the I/O interface 20.

[Step S21] The control circuit 21 inputs a source address via the I/O interface 20.

[Step S22] The holding circuit 25 stores data indicative of a source bank supplied from the block address register 23.

[Step S23] The page buffer 27c reads out data from the memory cell array 27d and holds it in the latch circuit.

[Step S24] The control circuit 21 inputs a destination address input command via the I/O interface 20.

[Step S25] The control circuit 21 inputs a destination address via the I/O interface 20.

[Step S26] The control circuit 21 inputs an execute write command via the I/O interface 20.

[Step S27] The comparison circuit 26 compares a BADD signal supplied from the block address register 23 and a BADD_LT signal supplied from the holding circuit 25.

[Step S28] If the comparison circuit 26 judges as a result of a comparison in step S27 that the BADD signal and BADD_LT signal match, then step S33 will be performed. If the comparison circuit 26 judges that they do not match, then step S29 will be performed.

[Step S29] The column address register 22 resets a column address to "0."

[Step S30] A transfer between banks is performed. For example, if a transfer from the bank 27 to the bank 28 is performed, the data latched by the page buffer 27c is inverted by the MUX 27b, is supplied to the page buffer 28c via the MUX 28b, and is latched there.

[Step S31] The control circuit 21 judges whether an A9TO signal output from the column address register 22 is in the "H" state, that is to say, whether this is the last column. If this is the last column, then step S33 will be performed. If this is not the last column, then step S32 will be performed.

[Step S32] The column address register 22 increments a column address by one. The procedure returns to step S30 and the same process is repeated.

[Step S33] The data is written to a memory cell. If copy back operation is performed in the bank 27, that is to say, in the same bank, then the data latched by the page buffer 27c will be written to the memory cell array 27d. If a transfer from the bank 27 to the bank 28 is performed, that is to say, if copy back operation is performed between banks, then the data latched by the page buffer 28c will be written to the memory cell array 28d.

[Step S34] Whether the data was written normally to the memory cell is judged. If the data was not written normally, write operation is performed again. If the data was written normally, then the process terminates.

Now, a second embodiment of the present invention will be described.

Figure 10:
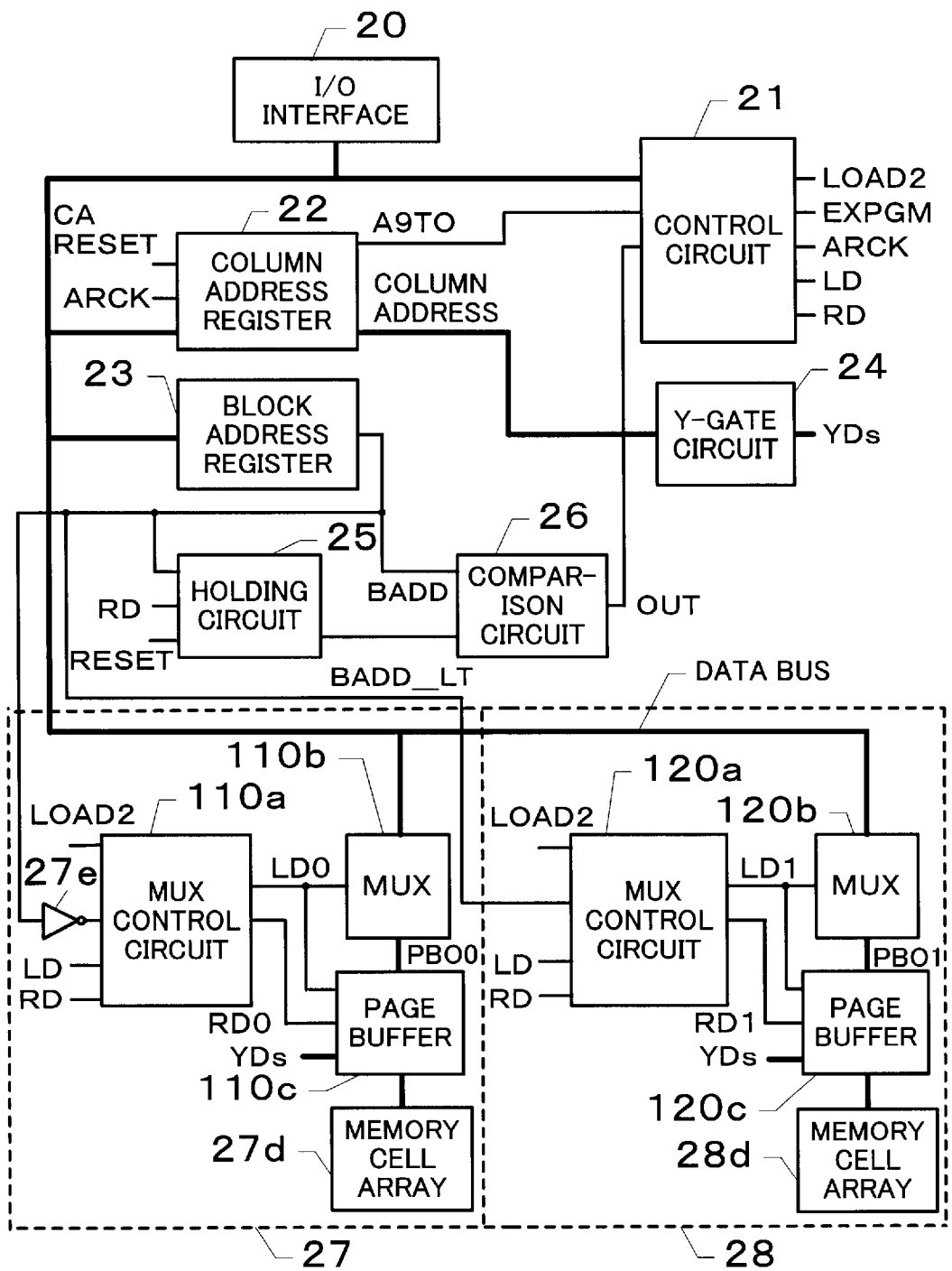
FIG. 10 is a view showing the structure of a second embodiment of the present invention.

FIG. 10 is a view showing the structure of a second embodiment of the present invention. Components in FIG. 10 which correspond to those shown in FIG. 2 are marked with the same symbols and descriptions of them will be omitted. The second embodiment shown in FIG. 10 differs slightly from the first embodiment shown in FIG. 2 in the internal structure of banks 27 and 28. For example, a bank 27 in FIG. 10 includes a MUX control circuit 110a, MUX 110b, and page buffer 110c in place of the MUX control circuit 27a, MUX 27b, and page buffer 27c respectively. Except for this, the second embodiment shown in FIG. 10 is the same as the first embodiment shown in FIG. 2.

Figure 11:
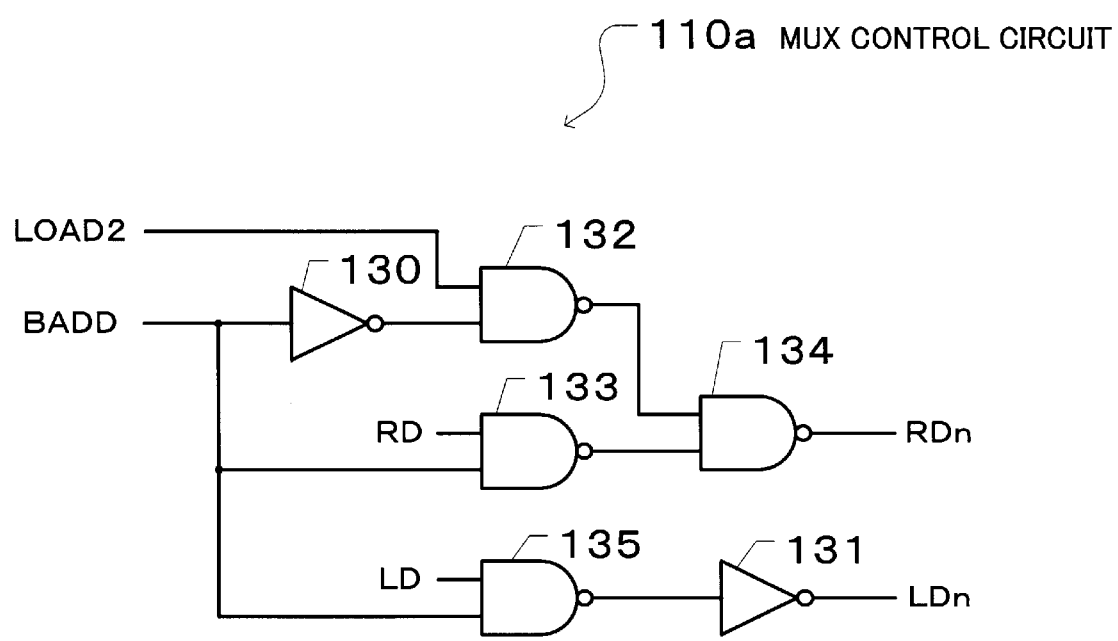
FIG. 11 is a detailed view showing the structure of the MUX control circuit shown in FIG. 10.

FIG. 11 is a detailed view showing the structure of the MUX control circuit 110a. As shown in FIG. 11, the MUX control circuit 110a includes inverters 130 and 131 and NAND gates 132 through 135.

The MUX control circuit 110a generates an RDn signal and LDn signal from a LOAD2 signal, BADD signal, RD signal, and LD signal and outputs them.

Figure 12:
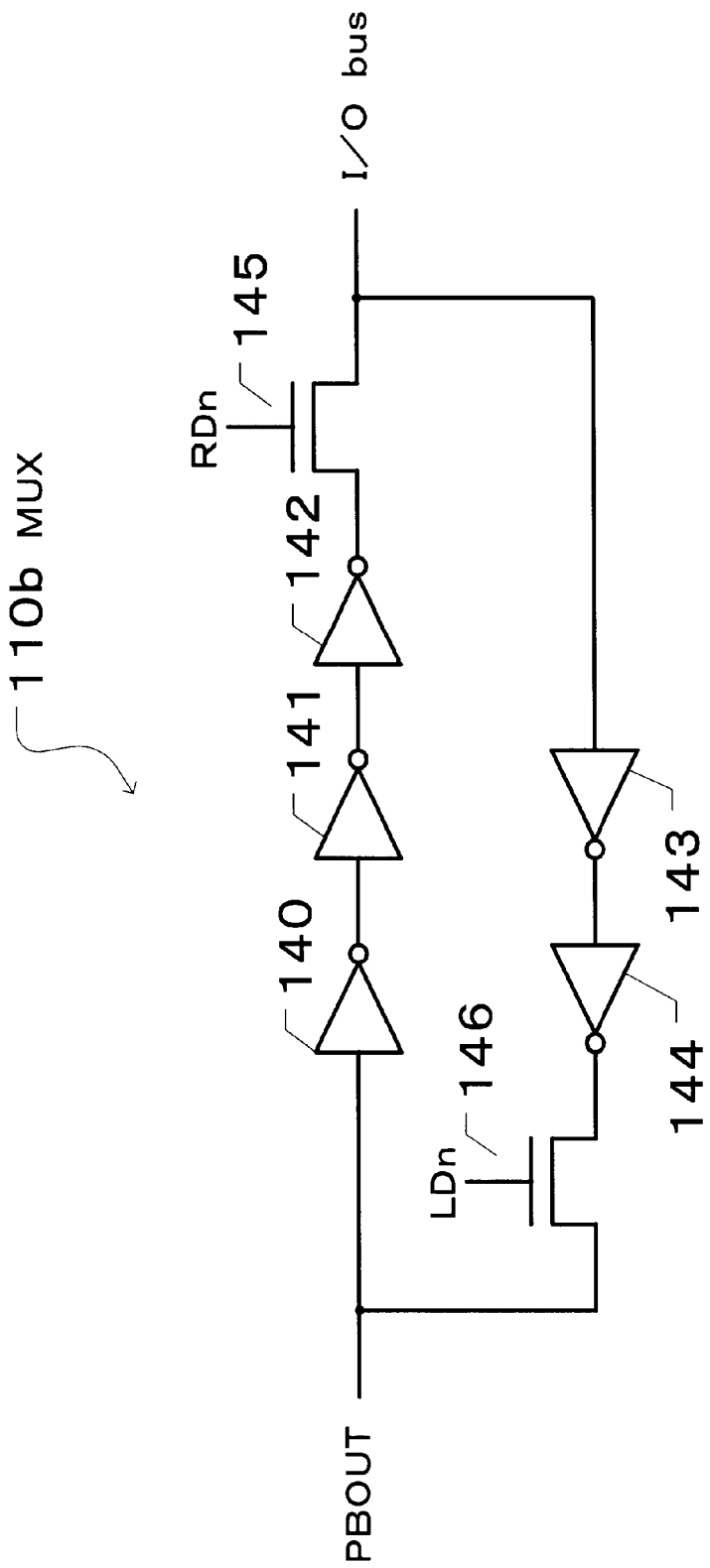
FIG. 12 is a detailed view showing the structure of the MUX shown in FIG. 10.

FIG. 12 is a detailed view showing the structure of the MUX 110b. As shown in FIG. 12, the MUX 110b includes inverters 140 through 144 and n-channel MOSFETs 145 and 146.

The MUX 110b inputs an LDn signal and RDn signal supplied from the MUX control circuit 110a shown in FIG. 11. If the RDn signal is in the "H" state, then the MUX 110b inverts the logic of data read out from the page buffer 110c via the inverters 140 through 142 and outputs the data to a data bus.

If the LDn signal is in the "H" state, then the MUX 110b supplies data input from the data bus to the page buffer 110c via the inverters 143 and 144.

Figure 13:
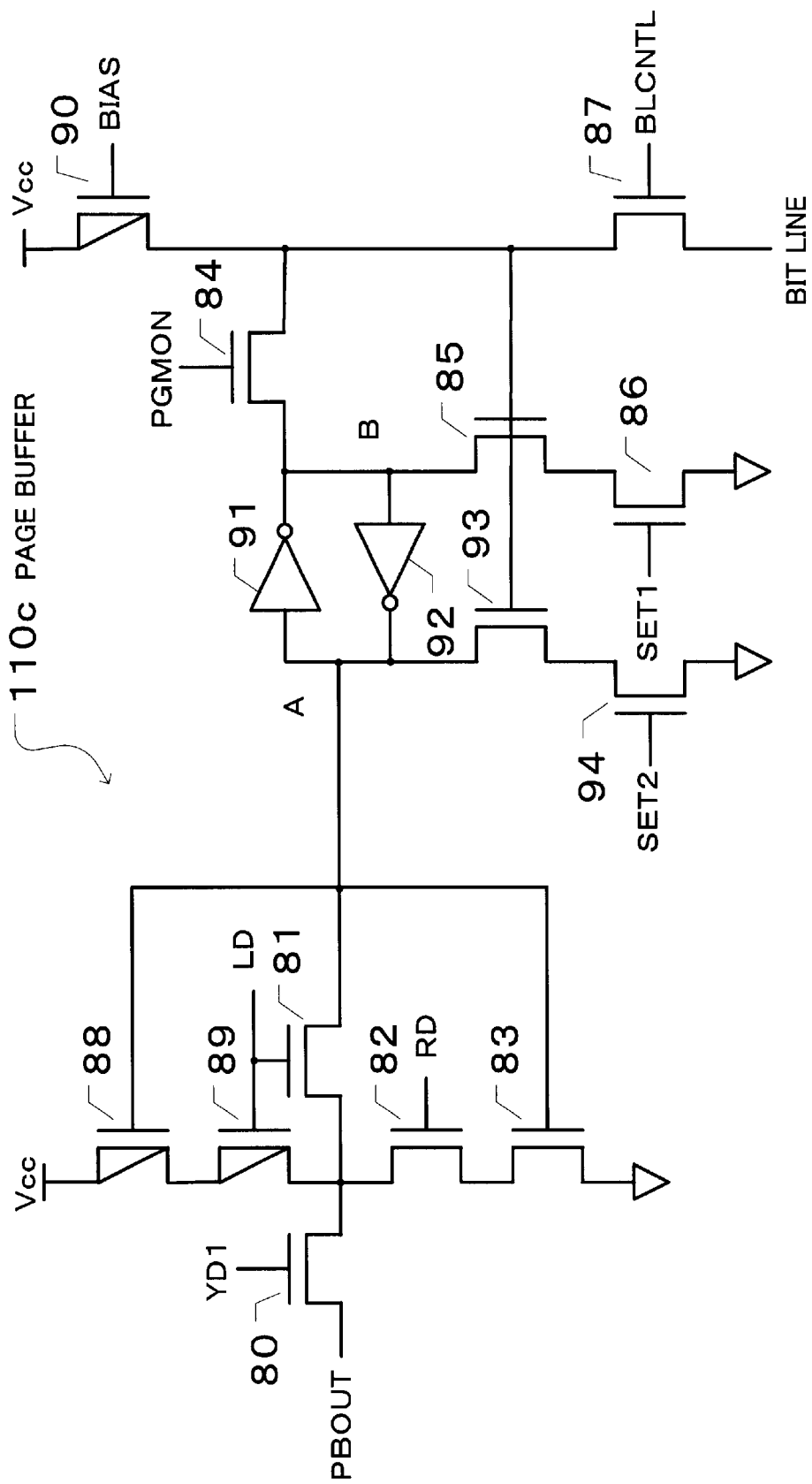
FIG. 13 is a detailed view showing the structure of the page buffer shown in FIG. 10.

FIG. 13 is a detailed view showing the structure of the page buffer 110c. Components in FIG. 13 which correspond to those in the page buffer 27c shown in FIG. 7 are marked with the same symbols and descriptions of them will be omitted. The page buffer 110c shown in FIG. 13 differs from the page buffer 27c shown in FIG. 7 in that the output terminal of an n-channel MOSFET 84 is connected to node B. Except for this, the page buffer 110c shown in FIG. 13 is the same as the page buffer 27c shown in FIG. 7.

Now, operation in the second embodiment will be described. Copy back operation in the same bank and copy back operation between banks will be described.

(1) Copy Back Operation in the Same Bank

Now, copy back operation in the bank 27 will be described.

First, when an inverted read command is input, an RD signal output from the control circuit 21 goes into the "H" state. When a source address is input after that, data indicative of a source block is stored in the block address register 23 and a BADD signal is output on the basis of this data. In this example, the bank 27 is a source, so the BADD signal goes into the "L" state.

The holding circuit 25 latches this BADD signal in the latch circuit made up of the inverters 42 and 43 shown in FIG. 3 and outputs a result obtained by inverting the latched data. As a result, a BADD_LT signal output from the holding circuit 25 goes into the "L" state.

Data is read out from the source address in the memory cell array 27d in the bank 27 and is stored in the page buffer 110c. Now, attention will be given to a single bit. In the circuit shown in FIG. 13, a BIAS signal is put into the "L" state and a SET2 signal is put into the "H" state. By doing so, the node A goes into the "L" state, the node B goes into the "H" state, and the latch circuit made up of the inverters 91 and 92 is initialized. Next, the SET2 signal is returned to the "L" state and a BLCNTL signal is put into the "H" state. By doing so, the circuit shown in FIG. 13 is connected to a bit line and sense operation is begun. When a predetermined period of time has elapsed after the sense operation being begun, a SET1 signal is put into the "H" state and data sensed is imported into the latch circuit made up of the inverters 91 and 92.

It is assumed that data stored in a memory cell is "0." Then the memory cell is electrically in the OFF state. Therefore, when the n-channel MOSFET 87 goes into the ON state, input to the n-channel MOSFETs 85 and 93 goes into the "H" state.

When the SET1 signal goes into the "H" state in this state of things, the node B goes into the "L" state. Therefore, the nodes A and B of the latch circuit made up of the inverters 91 and 92 latch the "H" and "L" states respectively.

Subsequently, when a destination address input command is input, the control circuit 21 puts the RD signal into the "L" state. When a destination address is input, data indicative of a destination block is stored in the block address register 23 and a BADD signal is output on the basis of this data. In this example, copy back is performed in the bank 27, so the BADD signal goes into the "L" state.

The comparison circuit 26 inputs the BADD_LT signal corresponding to the data indicative of the source bank stored in the holding circuit 25 and compares this BADD_LT signal and the BADD signal. In this example, these signals are in the "L" state, so an OUT signal output from the comparison circuit 26 goes into the "L" state.

The control circuit 21 puts a LOAD2 signal into the "L" state because a transfer will be performed in the same bank. Moreover, the control circuit 21 puts an LD signal into the "H" state because write operation will be performed.

On the basis of, for example, the LOAD2 signal supplied from the control circuit 21 and the BADD signal supplied from the block address register 23, the MUX control circuit 110a puts an LD0 signal into the "H" state and puts an RD0 signal into the "L" state.

As a result, the data latched by the page buffer 110c will be written to the memory cell array.

To be concrete, a PGMON signal, the BIAS signal, the BLCNTL signal, the SET1 signal, and the SET2 signal go into the "H," "H," "H," "L," and "L" states respectively. Therefore, voltage applied to the node B of the latch circuit made up of the inverters 91 and 92 is read out via the n-channel MOSFET 84 and is written to a predetermined cell in the memory cell array 27d via the n-channel MOSFET 87.

In this example, the node B is in the "L" state, so "0" will be written to the predetermined cell in the memory cell array 27d.

After writing to the memory cell is completed, verify operation will be performed to check whether the data was written normally. In this verify operation, the PGMON signal, the BIAS signal, and the BLCNTL signal are put first into the "L," "L," and "H" states, respectively, to perform sense operation. After a certain period of time has elapsed, the SET2 signal is put into the "H" state. As a result, the data written is read out and is latched by the latch circuit made up of the inverters 91 and 92. If the data was written normally, the nodes A and B will go into the "L" and "H" states respectively. Subsequent writing therefore is prohibited. The same operation will be performed on memory cells not to be written.

If writing to the memory cell was not performed normally, the nodes A and B will go into the "H" and "L" states, respectively, after the SET2 signal being put into the "H" state. Therefore, writing and verify operation will be repeated until writing is performed normally.

By performing the above operation, copy back operation in the same bank will be completed.

(2) Copy Back Operation Between Banks

Now, operation performed when copy back from the bank 27 to the bank 28 is executed will be described.

First, when an inverted read command is input, an RD signal output from the control circuit 21 goes into the "H" state. When a source address is input after that, data indicative of a source block is stored in the block address register 23 and a BADD signal is output on the basis of this data. In this example, the bank 27 is a source, so the BADD signal goes into the "L" state.

The holding circuit 25 latches this BADD signal in the latch circuit made up of the inverters 42 and 43 shown in FIG. 3 and outputs a result obtained by inverting the latched data. As a result, a BADD_LT signal output from the holding circuit 25 goes into the "L" state.

Data is read out from the source address in the memory cell array 27d in the bank 27 and is stored in the page buffer 110c. Now, attention will be given to a single bit. In the circuit shown in FIG. 13, a BIAS signal is put into the "L" state and a SET2 signal is put into the "H" state. By doing so, the node A goes into the "L" state, the node B goes into the "H" state, and the latch circuit made up of the inverters 91 and 92 is initialized. Next, the SET2 signal is returned to the "L" state and a BLCNTL signal is put into the "H" state. By doing so, the circuit shown in FIG. 13 is connected to a bit line and sense operation is begun. When a predetermined period of time has elapsed after the sense operation being begun, a SET1 signal is put into the "H" state and data sensed is imported into the latch circuit made up of the inverters 91 and 92.

It is assumed that data stored in a memory cell is "0." Then the memory cell is electrically in the OFF state. Therefore, when the n-channel MOSFET 87 goes into the ON state, input to the n-channel MOSFETs 85 and 93 goes into the "H" state.

When the SET1 signal goes into the "H" state in this state of things, the node B goes into the "L" state. Therefore, the nodes A and B of the latch circuit made up of the inverters 91 and 92 latch the "H" and "L" states respectively.

Subsequently, when a destination address input command is input, the control circuit 21 puts the RD signal into the "L" state. When a destination address is input, data indicative of a destination block is stored in the block address register 23 and a BADD signal is output on the basis of this data. In this example, the bank 28 is a destination, so the BADD signal goes into the "H" state.

The comparison circuit 26 inputs the BADD_LT signal corresponding to the data indicative of the source bank stored in the holding circuit 25 and compares this BADD_LT signal and the BADD signal. In this example, the BADD signal is in the "H" state and the BADD_LT signal is in the "L" state. Therefore, an OUT signal output from the comparison circuit 26 goes into the "H" state.

The control circuit 21 puts a LOAD2 signal into the "H" state because a transfer will be performed between the banks 27 and 28. Moreover, the control circuit 21 puts an LD signal into the "H" state because write operation will be performed.

As a result, in the MUX control circuit 110a the LOAD2 signal, BADD signal, RD signal, and LD signal shown in FIG. 11 go into the "H," "L," "L," and "H" states respectively. Therefore, an RD0 signal and LD0 signal go into the "H" and "L" states respectively.

In the MUX 110b where these signals are input, the n-channel MOSFET 145 goes into the ON state and the n-channel MOSFET 146 goes into the OFF state. Therefore, the data output from the page buffer 110c is output to a data bus via the inverters 140 through 142. As a result, the data will be inverted and be output.

On the other hand, in the MUX control circuit 120a the LOAD2 signal, BADD signal, RD signal, and LD signal go into the "H," "H," "L," and "H" states respectively. Therefore, an RD1 signal and LD1 signal go into the "L" and "H" states respectively.

Accordingly, in the MUX 120b where these signals are input, the n-channel MOSFET 145 goes into the OFF state and the n-channel MOSFET 146 goes into the ON state. As a result, the data input from the data bus is output to the page buffer 120c via the inverters 143 and 144. That is to say, the data will be output in its original condition.

At this time a CARESET signal input to the column address register 22 is put into the "H" state, so a column address is reset to "0." Each time an ARCK signal is toggled, a column address will be incremented by one. Output from the column address register 22 is supplied to the Y-gate circuit 24. The Y-gate circuit 24 generates a YDs signal and supplies it to the page buffers 110c and 120c. As a result, data specified by a column address is read out from the page buffer 110c, is inverted by the MUX 110b, flows through the MUX 120b, and is latched by a latch circuit in the page buffer 120c. This operation will be continued until an A9TO signal output from the column address register 22 goes into the "H" state, that is to say, until the transfer of data at all column addresses is completed.

When the transfer of data at all column addresses is completed, the MUX control circuit 120a puts an LD1 signal indicative of load into the "H" state on the basis of, for example, the LOAD2 signal supplied from the control circuit 21 and the BADD signal supplied from the block address register 23. As a result, the data latched by the page buffer 120c will be written to the memory cell array 28d.

To be concrete, a PGMON signal, the BIAS signal, the BLCNTL signal, the SET1 signal, and the SET2 signal go into the "H," "H," "H," "L," and "L" states respectively. Therefore, voltage applied to the node B of the latch circuit made up of the inverters 91 and 92 is read out via the n-channel MOSFET 84 and is written to a predetermined cell in the memory cell array 28d via the n-channel MOSFET 87.

In this example, the node B is in the "L" state, so "0" will be written to the predetermined cell in the memory cell array 28d.

After writing to the memory cell is completed, verify operation will be performed to check whether the data was written normally. In this verify operation, the PGMON signal, the BIAS signal, and the BLCNTL signal are put first into the "L," "L," and "H" states, respectively, to perform sense operation. After a predetermined period of time has elapsed, the SET2 signal is put into the "H" state. As a result, the data written is read out and is latched by the latch circuit made up of the inverters 91 and 92. If the data read out and the data written match, the nodes A and B will go into the "L" and "H" states respectively. Subsequent writing therefore is prohibited. The same operation will be performed on memory cells not to be written.

With a memory cell where writing was not performed normally, the nodes A and B will go into the "H" and "L" states, respectively, after the SET2 signal being put into the "H" state. Therefore, writing and verify operation will be repeated until writing is performed normally.

By performing the above operation, copy back operation between banks will be completed.

As described above, with the second embodiment of the present invention data held in a latch circuit is written again in the case of transferring in the same bank. Moreover, in the case of transferring between banks, data held in a latch circuit is transferred in order of column address to a latch circuit in a destination bank and is written. This is the same with the first embodiment. Therefore, data can be copied back not only in the same bank but also between banks.

Furthermore, conventionally, to write again data read out to the same bank, the operation of inverting the logic of the data has been necessary. In the second embodiment of the present invention, however, data can be written in its original condition without its logic being inverted. This is the same with the first embodiment.

In addition, in the second embodiment of the present invention the n-channel MOSFET 84 is connected to the node B. This makes the state of data latched by the latch circuit made up of the inverters 91 and 92 in the case of the data being written and the state of data latched by the latch circuit made up of the inverters 91 and 92 in the case of the data being read out the same.

Figure 14:
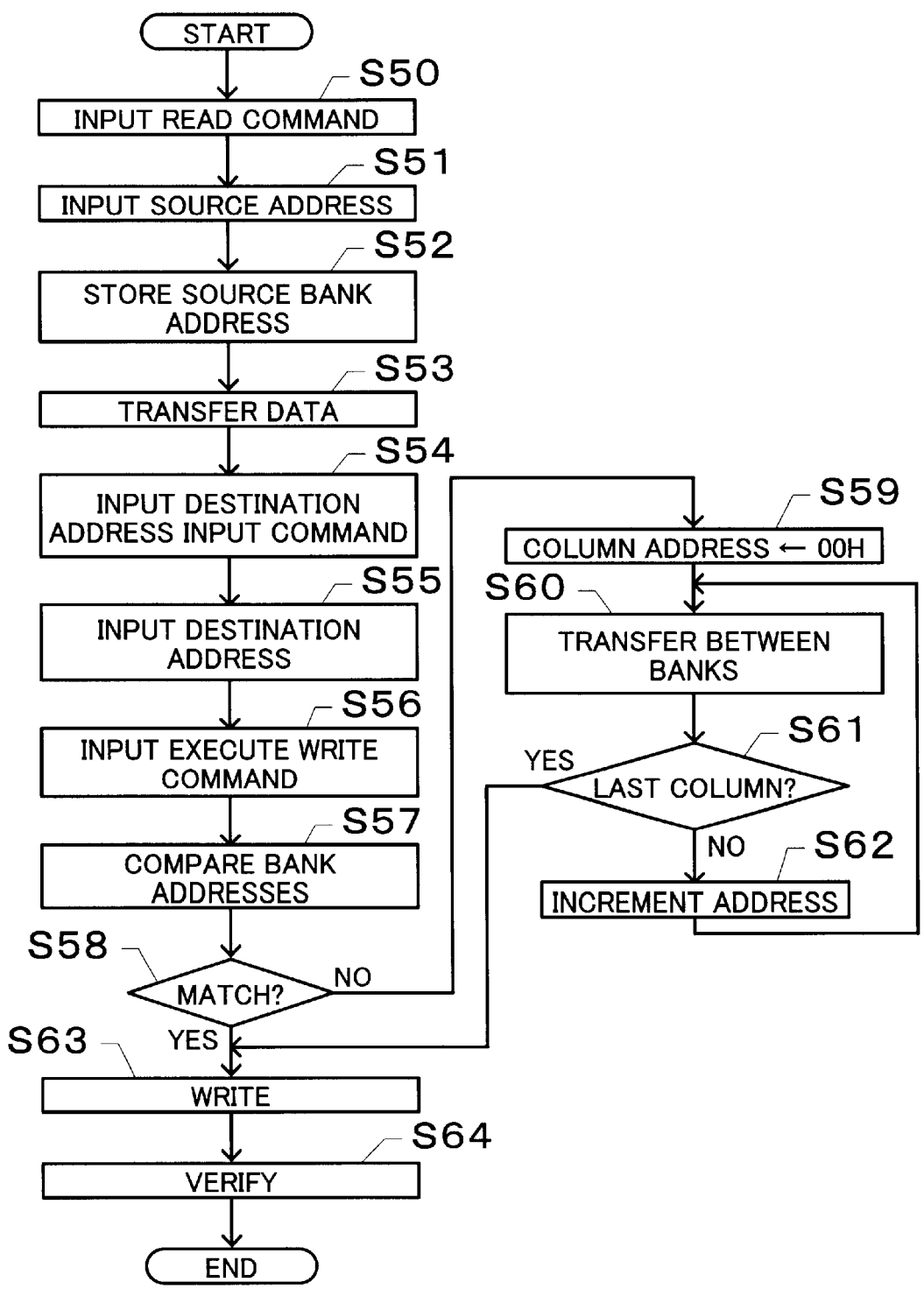
FIG. 14 is a flow chart for describing the flow of a process performed in the embodiment shown in FIG. 10.

Now, the flow of a process performed in the second embodiment will be described by reference to FIG. 14. The following steps will be performed if a process shown in FIG. 14 is begun.

[Step S50] The control circuit 21 inputs a read command via the I/O interface 20.

[Step S51] The control circuit 21 inputs a source address via the I/O interface 20.

[Step S52] The holding circuit 25 stores data indicative of a source bank supplied from the block address register 23.

[Step S53] The page buffer 110c reads out data from the memory cell array 27d and holds it in the latch circuit.

[Step S54] The control circuit 21 inputs a destination address input command via the I/O interface 20.

[Step S55] The control circuit 21 inputs a destination address via the I/O interface 20.

[Step S56] The control circuit 21 inputs an execute write command via the I/O interface 20.

[Step S57] The comparison circuit 26 compares a BADD signal supplied from the block address register 23 and a BADD_LT signal supplied from the holding circuit 25.

[Step S58] If the comparison circuit 26 judges as a result of a comparison in step S57 that the BADD signal and BADD_LT signal match, then step S63 will be performed. If the comparison circuit 26 judges that they do not match, then step S59 will be performed.

[Step S59] The column address register 22 resets a column address to "0."

[Step S60] A transfer between banks is performed. For example, if a transfer from the bank 27 to the bank 28 is performed, the data latched by the page buffer 110c is inverted by the MUX 110b, is supplied to the page buffer 120c via the MUX 120b, and is latched there.

[Step S61] The control circuit 21 judges whether an A9TO signal output from the column address register 22 is in the "H" state, that is to say, whether this is the last column. If this is the last column, then step S63 will be performed. If this is not the last column, then step S62 will be performed.

[Step S62] The column address register 22 increments a column address by one. The procedure returns to step S60 and the same process is repeated.

[Step S63] The data is written to a memory cell. If copy back operation is performed in the bank 27, that is to say, in the same bank, then the data latched by the page buffer 110c will be written to the memory cell array 27d. If a transfer from the bank 27 to the bank 28 is performed, that is to say, if copy back operation is performed between banks, then the data latched by the page buffer 120c will be written to the memory cell array 28d.

[Step S64] Whether the data was written normally to the memory cell is judged. If the data was not written normally, write operation is performed again. If the data was written normally, then the process terminates.

As described above, with the first and second embodiments of the present invention data can be copied between banks. Therefore, copy back can be performed even in a chip which includes a plurality of memory cell array banks for increasing capacity.

With conventional methods, data is read out to the outside of a semiconductor memory and then is written again. Therefore, it takes 26.4 $\mu$s to read out, for example, 528 bytes of data to the outside of a semiconductor memory in a 50-nanosecond cycle. Moreover, it takes 26.4 $\mu$s to load again the data into a page buffer. With time taken to, for example, input commands, it takes 260.25 $\mu$s to copy one page. In the present invention, copy back in the same bank and between banks can be performed in 207.45 $\mu$s and 233.85 $\mu$s respectively. Therefore, the time required to perform copy back in the same bank and between banks can be shortened by 20.3% and 10.15% respectively.

The circuit diagrams shown in the first and second embodiments are simple examples. It is a matter of course that the scope of the present invention is not limited to these cases.

The descriptions of the first and second embodiments have been given with a case where there are two banks as an example. However, it is a matter of course that the present invention is applicable to cases where there are more than two banks.

As has been described in the foregoing, with the nonvolatile semiconductor memory having a plurality of banks, according to the present invention, a judgment circuit judges in the case of performing copy back between banks whether a transfer is performed in the same bank or between banks, data stored in a first transfer circuit, being a latch circuit, is written to the bank in the case of a transfer being performed in the same bank, and, in the case of a transfer being performed between banks, data stored in a latch in the first transfer circuit on the source side is stored in a latch in a first transfer circuit on the destination side via second transfer circuits on the source and destination sides and then is written to a destination bank. Data therefore can be transferred not only in the same bank but also between banks.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A nonvolatile semiconductor memory having a plurality of banks, the memory comprising:

an input circuit for accepting input of a copy back command which requests a data transfer in the memory;

a judgment circuit for judging at the time of the copy back command being input from the input circuit whether a source and a destination are in the same bank;

a first transfer circuit for transferring, in the case of the judgment circuit judging that the source and the destination are in the same bank, data in the same bank; and a second transfer circuit for transferring, in the case of the judgment circuit judging that the source and the destination are in different banks, data between the two different banks.

2. The semiconductor memory according to claim 1, wherein:

the first transfer circuit includes a latch circuit for latching without inverting or for inverting and latching data stored in a memory cell included in the bank;

the second transfer circuit includes a buffer for inverting and outputting a signal latched by the latch circuit; and if data is transferred by the first transfer circuit or the second transfer circuit, data stored in the memory cell is latched by the latch circuit without being inverted.

3. The semiconductor memory according to claim 2, wherein if data is transferred in the same bank by the first transfer circuit, data latched by the latch circuit without being inverted is written to the memory cell in its original condition.

4. The semiconductor memory according to claim 2, wherein:

the latch circuit one terminal of which is connected to the buffer includes inverters connected in inverse parallel;

data stored in a memory cell is imported into the terminal connected to the buffer in the case of latching without inverting;

data stored in a memory cell is imported into a terminal on the side opposite the buffer in the case of inverting and latching; and data is read out from the terminal connected to the buffer and is written to the memory cell in the case of writing to the memory cell.

5. The semiconductor memory according to claim 2, wherein if data is transferred between banks by the second transfer circuit:

in a source bank, data latched by the latch circuit without being inverted is inverted by an inverting circuit and then is inverted and output by the buffer; and in a destination bank, the data inverted by the buffer is input in its original condition and is written to a corresponding memory cell.

6. The semiconductor memory according to claim 5, wherein if data is transferred between banks by the second transfer circuit, the data is transferred by the column address.

7. The semiconductor memory according to claim 1, wherein:

the first transfer circuit includes a latch circuit for latching without inverting or for inverting and latching data stored in a memory cell included in the bank;

the second transfer circuit includes a buffer for inverting and outputting a signal latched by the latch circuit; and if data is transferred by the first transfer circuit or the second transfer circuit, data stored in the memory cell is inverted and latched by the latch circuit.

8. The semiconductor memory according to claim 7, wherein if data is transferred in the same bank by the first transfer circuit, data inverted and latched by the latch circuit is inverted again and is written to the memory cell.

9. The semiconductor memory according to claim 7, wherein:

the latch circuit one terminal of which is connected to the buffer includes inverters connected in inverse parallel;

data stored in a memory cell is imported into the terminal connected to the buffer in the case of latching without inverting;

data stored in a memory cell is imported into a terminal on the side opposite the buffer in the case of inverting and latching; and data is read out from the terminal on the side opposite the buffer and is written to the memory cell in the case of writing to the memory cell.

10. The semiconductor memory according to claim 7, wherein if data is transferred between banks by the second transfer circuit:

in a source bank, data inverted and latched by the latch circuit is inverted by the inverting circuit and then is inverted and output by the buffer; and in a destination bank, the data inverted by the inverting circuit is inverted again and is written to a corresponding memory cell.

11. The semiconductor memory according to claim 10, wherein if data is transferred between banks by the second transfer circuit, the data is transferred by the column address.

* * * * *